US008106413B2

(12) United States Patent
Kumei et al.

(10) Patent No.: US 8,106,413 B2
(45) Date of Patent: Jan. 31, 2012

(54) LIGHT EMITTING DEVICE WITH A POROUS ALUMINA REFLECTOR MADE OF AGGREGATION OF ALUMINA PARTICLES

(75) Inventors: Masami Kumei, Yokohama (JP); Takaaki Sakai, Kashiwa (JP); Masanori Sato, Machida (JP)

(73) Assignee: Stanley Electric Co., Ltd., Tokyo (JP)

( * ) Notice: Subject to any disclaimer, the term of this patent is extended or adjusted under 35 U.S.C. 154(b) by 433 days.

(21) Appl. No.: 11/732,216

(22) Filed: Apr. 3, 2007

(65) Prior Publication Data

US 2007/0262335 A1 Nov. 15, 2007

(30) Foreign Application Priority Data

May 12, 2006 (JP) ................................. 2006-133627

(51) Int. Cl.
*H01L 29/22* (2006.01)
*H01L 21/00* (2006.01)
(52) U.S. Cl. ........................................... 257/98; 438/29
(58) Field of Classification Search .................... 257/98, 257/E33.072; 438/25, 26, 29
See application file for complete search history.

(56) References Cited

U.S. PATENT DOCUMENTS

| 7,489,076 B2* | 2/2009 | Mitsuyama et al. .......... 313/512 |
| 7,573,072 B2* | 8/2009 | Setlur et al. ..................... 257/98 |
| 2008/0043444 A1 | 2/2008 | Hasegawa et al. |

FOREIGN PATENT DOCUMENTS

| JP | 9-293904 A | 11/1997 |
| JP | 2005-179147 A | 7/2005 |
| JP | 2005-285836 A | 10/2005 |
| JP | 2006-093565 A | 4/2006 |
| JP | 2006-108180 A | 4/2006 |
| KR | 0465096 | 1/2005 |

OTHER PUBLICATIONS

Korean Office Action dated Feb. 12, 2009 (4 pages), and English translation thereof (3 pages) issued in counterpart Korean Application No. 10-2007-43294.

Japanese Office Action dated Jun. 28, 2011 and English translation thereof in counterpart Japanese Application No. 2006-133627.

* cited by examiner

*Primary Examiner* — Hung Vu

(74) *Attorney, Agent, or Firm* — Holtz, Holtz, Goodman & Chick, PC

(57) ABSTRACT

A light emitting device is provided which has a reflector having a reflection surface made of porous alumina having an apparent density of 2.5 to 3.3 g/cm$^3$, and an LED disposed on the reflection surface or near the reflection surface. There are provided: a light emitting device equipped with an LED chip and a reflector having a high reflectivity relative to near infrared to ultraviolet rays irradiated from an LED chip and fluorescent material; and the reflector.

23 Claims, 7 Drawing Sheets

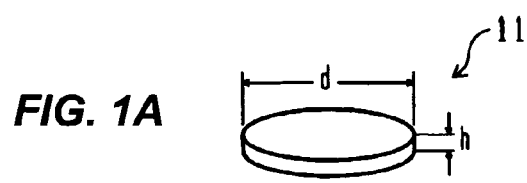
FIG. 1A
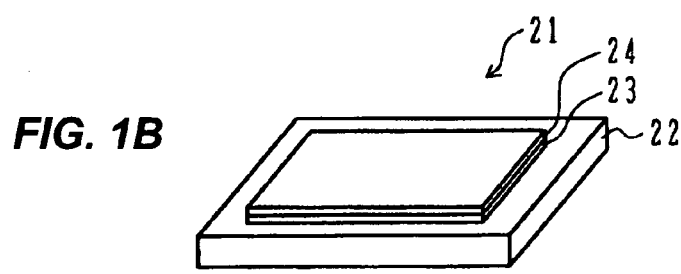
FIG. 1B
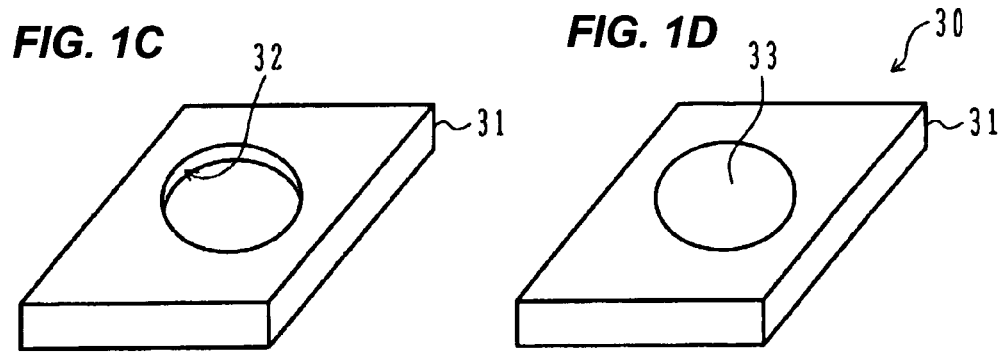
FIG. 1C
FIG. 1D

|  | REFLECTIVITY (% vs. BaSO4) | | | | APPARENT DENSITY (g/cm³) |
| --- | --- | --- | --- | --- | --- |
|  | 350nm | 450nm | 550nm | 650nm |  |
| COMPARATIVE EXAMPLE SAMPLE (Ag PLATED) | 63.7 | 87.4 | 91.7 | 92.7 | — |
| COMPARATIVE EXAMPLE SAMPLE (BULK ALUMINA BODY) | 65.0 | 83.8 | 84.5 | 85.3 | 3.68 |
| SUBJECT SAMPLE (POROUS ALUMINA BODY) | 99.6 | 99.4 | 99.7 | 99.5 | 2.82 |

FIG.4A
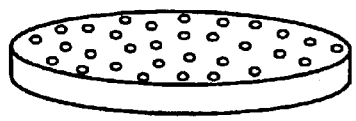
FIG.4B
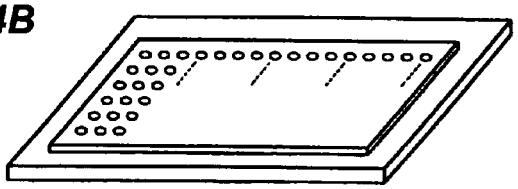
FIG.4C
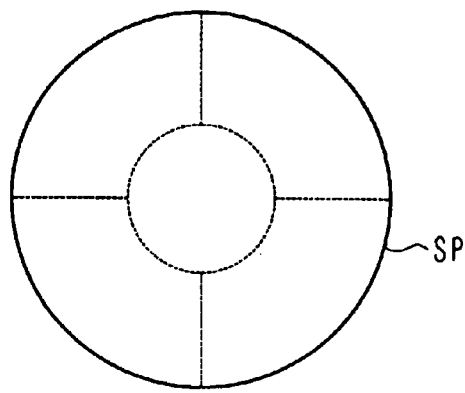
FIG.4D
|  | STRIPPING SPOTS | DISCOLORATION SPOTS | DEVICE RELATIVE BRIGHTNESS |
|---|---|---|---|
| COMPARATIVE EXAMPLE SAMPLE (Ag PLATED) | 11/1000 | 85/100 | 100 |
| COMPARATIVE EXAMPLE SAMPLE (BULK ALUMINA BODY) | 2/1000 | 0/100 | 102 |
| SUBJECT SAMPLE (POROUS ALUMINA BODY) | 1/1000 | 0/100 | 114 |

LIGHT EMITTING DEVICE WITH A POROUS ALUMINA REFLECTOR MADE OF AGGREGATION OF ALUMINA PARTICLES

CROSS REFERENCE TO RELATED APPLICATION

This application is based on and claims priority of Japanese Patent Application No. 2006-133627 filed on May 12, 2006, the entire contents of which are incorporated herein by reference.

BACKGROUND OF THE INVENTION

A) Field of the Invention

The present invention relates to a light emitting device and its manufacture method, and more particularly to a light emitting device equipped with a reflector and its manufacture method.

B) Description of the Related Art

Semiconductor light emitting elements such as light emitting diodes (LED) are used in an information display light source and the like, as compact and high efficiency light sources. Improvements on brightness and efficiency have recently progressed so that application of semiconductor light emitting devices has extended to vehicle illumination and general illumination. A light emitting device is constituted of a semiconductor chip, a container for housing the semiconductor chip, an electronic circuit and the like.

The container has a recess accommodating the components and constituted of a single member or a combination of a plurality of members. The container is made of ceramic, glass, resin, conductor whose surface is covered with an insulating film or the like. A wiring layer for supplying a light emitting element with electric power is formed extending from the recess bottom of the container to the external.

The light emitting element is fixedly bonded to the wiring layer (on an electrode) on the bottom of the recess, for example, at the bottom surface of the light emitting device, with conductive adhesive. The conductive adhesive commonly used is silver (Ag) paste, solder, and eutectic material such as AuSn. The electrode on the top surface is connected to a wiring layer by an Au wire or the like. Two electrodes may be formed on the top surface side, or flip-chip bonding may be performed.

Resin such as silicone resin which contains, if necessary, dispersed fluorescence emission material (fluorescent material), is filled in the recess to seal the light emitting element and form a light emitting device. The fluorescent material absorbs at least a portion of emission from a semiconductor chip and emits wavelength converted light.

Light emitted from the semiconductor chip repeats reflection and absorption at the fluorescent member and the inner surface of the recess of the container, and is finally output to the external. If the material of the container exhibits absorption relative to light irradiated from the semiconductor chip or fluorescent material, light is absorbed in the recess and attenuated. Therefore, luminance of the light emitting device is lowered.

If the material of the container has optical permeability relative to light irradiated from the semiconductor chip or fluorescent member, the light transmits through the inner wall of the recess and leaks to the external other than the opening. Therefore, luminance of the light emitting device is lowered.

It is known that a reflector such as a reflection layer is formed on the recess inner surface of the container. An electrode serving also as a metal reflector is patterned on the recess inner surface in some cases. The electrode serving also as the electrode is not formed on the whole recess inner surface, but is often formed partially in accordance with an electrode pattern for feeding power to the LED chip. For example, patterning on the recess bottom (substrate surface) with an insulating space, patterning on the recess bottom and inner sidewall with an insulating space, or patterning on the recess inner sidewall with an insulating space, or the like, may be employed. The insulating space prevents electric short while power is supplied to the semiconductor chip.

Making a light emitting element container compact and thin has recently advanced rapidly. A space between reflector patterns formed on the recess inner surface of such a compact and thin container is desired to be as narrow as possible to increase a light use efficiency. If this space is made narrower than 0.3 mm, electric short is likely to occur in practice.

The material of the reflection layer is often metal such as Ag, Au, Cu and Al. Ag is suitable because it has a high reflectivity in the visible light range. Since Ag has a high reflectivity of 90% or more in the near infrared to visible light range, lowering luminance of the light emitting device can be suppressed relatively small. For example, a metalized layer is coated on the surface of an insulating board, and Ag is plated on the metalized layer. Alternatively, print ink made of Ag-containing material is coated or patterned by screen printing or the like and then sintered to form an Ag layer.

Ag has a property that it is likely to have chemical change when it contacts chemical substance containing sulfur, halogen or the like. For example, if Ag contacts sulfur contained in atmospheric air, there is a possibility that silver sulfide is formed. As silver sulfide is formed, the surface is discolored to black or gray. Light irradiated from the semiconductor chip or fluorescent member is absorbed in the discolored area so that luminance of the light emitting device is lowered. Ag has low adhesion to resin such as silicone. Lower luminance and defects due to interface stripping are likely occur during a long term use. A reflectivity in the ultraviolet range of 400 nm or shorter is 0 to 90% lower than that in the near infrared to visible light range, and is insufficient for use with the light emitting device.

The reflector is not required to have mirror reflection. It is sufficient if the reflector reflects light irradiated from LED and outputs the light to the external. Therefore, the reflector may be irregular or scattering reflector. A reflector with irregular reflection may be ceramics. White ceramics have a flat reflectivity in the visible light range. A reflection ring forming a reflection surface around LED is known. A ceramic substrate serving also as a reflector has been used as the substrate for mounting a semiconductor light emitting element.

JP-A-HEI-9-293904 proposes to plate gold (Au) on a connection terminal formed on the rear surface of an LED package to be connected to a wiring substrate and to plate silver (Ag) on a power feeding wiring formed on the top surface of the LED package to be connected to LED. If both the terminals are plated with Au, reflectivity at wavelengths shorter than 600 nm lowers. By plating the power feeding wiring on the top surface of the package with Ag, a high reflectivity is obtained even at a wavelength of 600 nm or shorter.

JP-A-2005-179147 proposes an LED ceramic substrate having a high reflectivity layer containing alumina, silica and magnesium. It teaches that it is preferable to set a silica content to 0.1 to 1 mass %, and a magnesium content to 0.01 to 0.5 mass %. It also teaches that as the silica content becomes lower than 0.1 mass %, a reflectivity lowers sharply, a peel strength rises sharply as the silica content becomes about 1 mass % or lower, a peel strength lowers sharply as a magnesium content becomes lower than 0.01 mass %. It describes that as a cover layer with a small silica content is formed on an area outside an LED mount area, a peel strength improves when wirings are formed. It also teaches that it is preferable to prevent inner pores from becoming large, in order to prevent the strength from being lowered. A measured bulk density and a measured apparent density take the same value. A reflectivity of disclosed ceramics is about 80% at most in the visible light range at a wavelength of 470 nm.

SUMMARY OF THE INVENTION

An object of the present invention is to provide: a light emitting device having a reflector having a high reflectivity from near infrared to ultraviolet light range irradiated from an LED chip and fluorescent material; and the reflector.

Another object of the present invention is to provide: a light emitting device equipped with a reflector having a high reflectivity and a high adhesion to sealing resin; and the reflector.

Still another object of the present invention is to provide: a light emitting device equipped with a reflector which has a high reflectivity, is hard to generate discoloration by chemical reaction, and can maintain a good luminance retention factor; and the reflector.

Another object of the present invention is to provide a light emitting device equipped with a reflector which has a high reflectivity and is electrically insulative.

According to one aspect of the present invention, there is provided a light emitting device comprising:

a reflector having a reflection surface made of porous alumina having an apparent density of 2.5 to 3.3 g/cm$^3$; and an LED disposed on the reflection surface or near the reflection surface.

According to another aspect of the present invention, there is provided a manufacture method for a light emitting device comprising steps of:

(a) pressing easy sintering alumina primary particles having an average particle diameter of 0.1 to 1.0 μm to form an alumina mold;

(b) sintering the alumina mold to form a porous alumina reflector; and (c) disposing an LED on the porous alumina reflector or near the porous alumina reflector.

A reflector having a high reflectivity is provided. It is possible to improve an external light emission efficiency of a light emitting device equipped with a reflector.

BRIEF DESCRIPTION OF THE DRAWINGS

FIGS. 1A and 1B are schematic perspective views showing the structures of an alumina sample and a silver sample, FIGS. 1C and 1D are schematic perspective views showing a standard reflector sample cell and a standard reflector sample.

FIGS. 4A and 4B are perspective views of samples formed with spots for a stripping test, FIG. 4C is an enlarged plan view of a spot, and FIG. 4D is a table listing results of stripping tests, discoloration tests and brightnesses of light emitting devices.

DESCRIPTION OF THE PREFERRED EMBODIMENTS

Figure 2A:
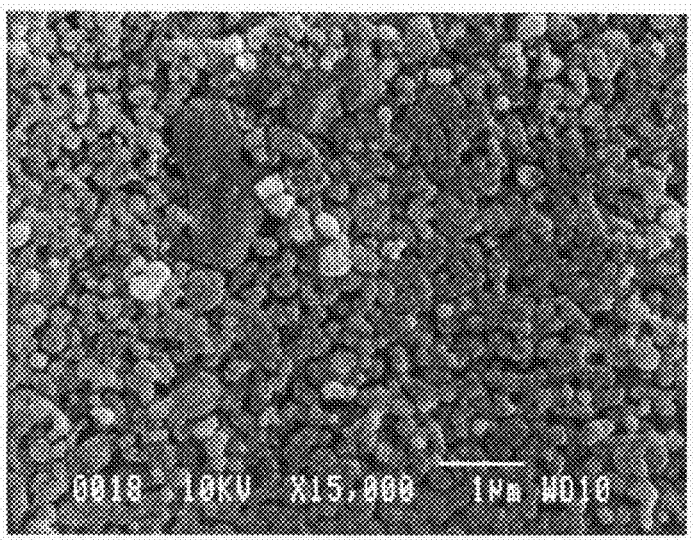
FIGS. 2A, 2B and 2C are SEM image of a subject alumina sample, its enlarged image, and a SEM image of a comparative alumina sample.

Alumina is a representative white ceramic material. An ordinary alumina body is manufactured by sintering primary particles having an average diameter of about 3 μm at a temperature of about 1600° C. or higher. Alumina of good quality for usual applications is alumina having a high strength, a high rigidity and excellent anti-abrasion and anti-corrosion.

Low temperature sintering alumina or easy sintering alumina which can make high density ceramic products at a low sintering temperature lower than 1600° C. is available from ceramic makers such as SHOWA DENKO K. K. and TAIMEI Chemicals Co. Ltd. A primary particle diameter of easy sintering alumina is fine. As a particle diameter is made fine, it is considered that a sintering temperature can be lowered.

Easy sintering alumina raw material sold in market by SHOWA DENKO K. K. includes high purity material and low purity material. A particle diameter measured with a micro track HRA distributes in a range of about 0.2 μm to about 2 μm or in a range of about 0.2 μm to 10 μm. An average particle diameter is listed from about 0.4 μm to about 2.4 μm. This raw material is characterized in that high density ceramics can be obtained at a low sintering temperature.

Easy sintering alumina sold in market by TAIMEI Chemicals Co. Ltd. has a high purity of 99.99% or higher, and primary particle diameters measured with SEM are 0.1 μm and 0.2 μm. This easy sintering alumina is characterized in that ceramic products having a high density, a high strength, a high rigidity, and excellent anti-abrasion and anti-corrosion can be manufactured by sintering the alumina at a temperature of 1300° C. or lower. There is another type of alumina capable of making a sintered body having excellent translucency by sintering the alumina at a temperature of 1600° C. or lower.

The present inventors have tried to form an LED reflector by using high purity easy sintering alumina. Ceramics having a high density and a high rigidity are respected for general applications. A reflector does not require a so high rigidity. The first importance is that a reflector has a high reflectivity at an emission wavelength range of 300 to 800 nm which is or may be an emission wavelength range of LED and fluorescent materials. Irregular or scattered reflection is permitted because it is sufficient if emission from LED and fluorescent materials is reflected and guided to an external.

FIG. 1A shows schematically the shape of an alumina sample 11 formed. The shape is a circular plate or a cylindrical column having an outer diameter d of 20 to 35 mm and a height h of 1 to 5 mm. A mold before sintering has fundamentally the same shape although the size is slightly larger.

As alumina row material for this subject sample, high purity (99.99 wt % or higher) easy sintering alumina powders (primary particles) not containing sintering auxiliaries were purchased from SHOWA DENKO K. K. An average primary particle diameter was 0.3 μm as measured by a micro track method (laser scattering method). A subject mold was formed by pressing the primary particles at a pressure of 1000 kg/cm$^2$. The mold was sintered for 3 hours at 1250° C. to form the alumina product of this subject sample.

For comparison, reflectors are also formed by using conventional alumina and silver plating.

As comparative example alumina raw material, 96% alumina powders were used which contain silica, magnesia and calcia of 4 wt % in total, as fluxes. The average primary particle diameter was about 3 μm. Similar to the subject sample, a comparative example mold was formed by die pressing the primary particles at a pressure of 1000 kg/cm$^2$. The shape was the same as that of the subject sample: a circular plate or a cylindrical column having an outer diameter of 20 to 35 mm and a height of 1 to 5 mm as shown in FIG. 1A. The mold was sintered for 3 hours at 1600° C. to form the alumina product of this comparative example sample.

FIG. 1B shows schematically the shape of a silver plated reflector sample. On an alumina substrate 22 of a square plate or tetragonal pillar having a plan size of 50 mm×50 mm and a height of 1 mm, a tungsten layer was formed as an underlying electrode 23, a nickel (Ni) layer and a Au layer are plated (not shown), and a silver layer 24 was electroplated thereon to thereby form a silver plated sample 21.

Figure 2B:
Figure 2C:
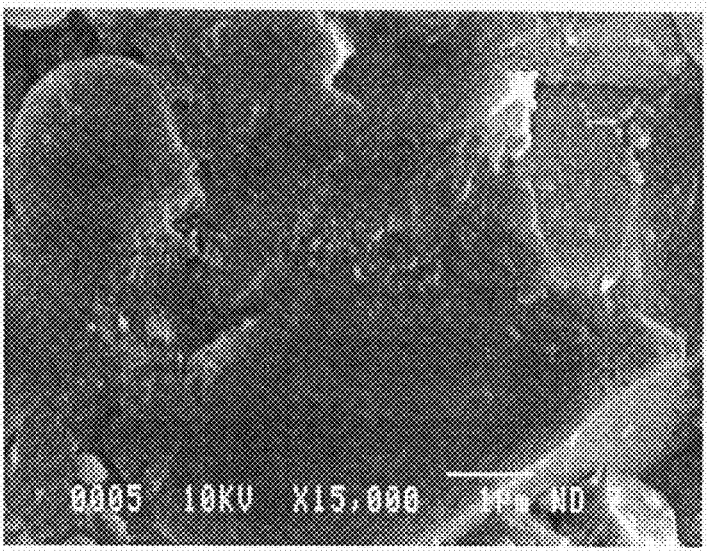

FIGS. 2A and 2C are scanning electron microscope (SEM) images of the circular surfaces of the alumina bodies of the subject sample and comparative example sample, respectively. FIG. 2B is a partially enlarged view of FIG. 2A. The alumina body of the subject sample shown in FIGS. 2A and 2B leaves the shapes of primary particles having an average particle diameter of 0.3 μm, the primary particles are coupled in contact areas and particles are separated in areas other then the contact areas to form a number of pores. This is called porous alumina.

The alumina body of the comparative example sample shown in FIG. 2C hardly leaves the shapes of primary particles having an average particle diameter of 3 μm. It is considered that particles grew greatly during sintering and gaps are buried. Pores are hardly observed. This is called bulk alumina.

It is considered that an apparent density of porous alumina of the subject sample is obviously lower than that of bulk alumina of the comparative example sample. An interface between pores (air) and alumina particles forms an optical interface. It is considered that since the diameter of the alumina particle is about 0.3 μm, the alumina particle surface functions as an optical scattering center. Since the shapes of particles are left, there is a possibility that the contact area between particles also forms an optical interface.

An apparent density was measured in the following manner. Weights of the sintered samples were measured with an electronic balance. The diameter and height were measured with calipers. Volumes were calculated from the measured size. The calculated volume is therefore a volume including open pores and closed pores. An apparent density was calculated by a weight divided by a volume.

A reflectivity was measured in the following manner.

A reflectivity relative to light having a wavelength of 300 to 800 nm was measured for the subject porous alumina sample, for the comparative example bulk alumina sample having a height of 1 mm and for the comparative example silver plated sample. The measurement instruments used were a ultraviolet/visual spectral photometer (UV-3100PC, Shimadzu Corporation) and an integrating sphere unit (ISR-3100). Barium sulfate (Wako Pure Chemical Industries, Ltd., guaranteed reagents) was used for standard reflector material.

FIGS. 1C and 1D show a standard reflector sample cell and a standard reflector. The standard reflector sample cell 31 has a recess 32 having a diameter of 35 mm and a depth of 5 mm. A standard sample 33 was embedded in this recess 32 to form the standard reflector sample 30.

Figures 3A, 3B:
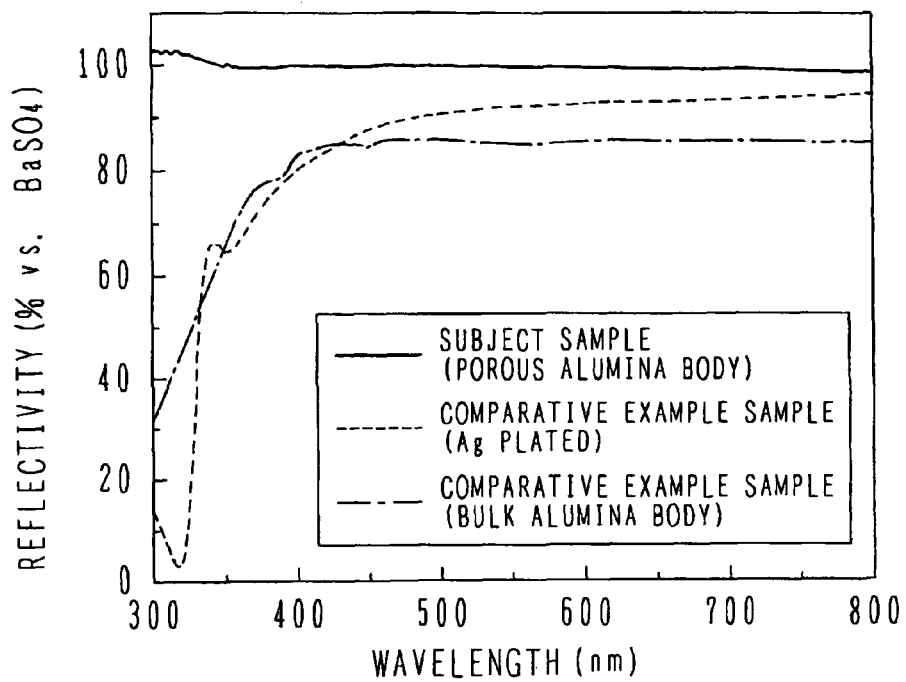
FIG. 3A is a graph showing a reflectivity of each sample.
FIG. 3B is a table listing respective reflectivities at typical wavelengths and apparent densities of alumina samples.

FIGS. 3A and 3B show all measurement results. The standard reflection sample 30 and plate-shape samples 11 and 21 were set upright and light was irradiated to the sample surfaces in a horizontal direction.

FIG. 3A is a graph showing reflectivity spectra. Using a reflectivity of $BaSO_4$ as a reference, a relative reflectivity of the subject alumina sample is extremely high, about 99% or higher, in the whole measurement wavelength range of 300 to 800 nm. A relative reflectivity of 95% or higher may be expected even if there are variations in raw materials, manufacture process conditions and the like.

A reflectivity of the comparative example silver plated sample is about 95% at a wavelength of 800 nm, lowers as the wavelength shortens, is about 87% at a wavelength of 450 nm, and lowers greatly in the wavelength range of 300 to 400 nm.

A reflectivity of the comparative example alumina sample takes a relatively stable value of about 85% at a wavelength of 450 nm or longer. However, the reflectivity lowers greatly in the range of a wavelength of about 400 nm or shorter, and is about 30% at a wavelength of 300 nm.

The reason why the reflectivity of the subject alumina sample is high may be ascribed first to pores in the sample. It can be considered that as pores become scattering centers, incidence light is irregularly reflected to increase the reflectivity. By using the reflector of the subject alumina sample, it is expected that a light emitting device can be provided which exhibits a high reflectivity from near infrared to ultraviolet light, irradiated from LED or phosphorous materials, is bright and has a high external emission efficiency. Since the comparative alumina sample has no pores or a little pores, the number of optical interfaces is small so that light transmits without contributing to a reflectivity. Since purity of comparative alumina is low, there is a possibility that light is absorbed during transmission. These may be the reasons of a low reflectivity.

FIG. 3B is a table collectively showing reflectivities and apparent densities. A relative reflectivity is used by using, as references, reflectivities of $BaSO_4$ at wavelengths of 350 nm, 450 nm, 550 nm and 650 nm shown in the graph of FIG. 3A. The rightmost column shows apparent densities. An apparent density of the bulk alumina body of the comparative example sample is 3.68 g/cm$^3$, whereas an apparent density of the subject porous alumina body is surely as low as 2.82 g/cm$^3$. A low apparent density may be ascribed to that a number of pores observed in the SEM image are contained in the porous alumina body.

A sufficiently high reflectivity may be expected even if the number of pores is halved. From this viewpoint, an apparent density is preferably 3.3 g/cm$^3$ or lower. If primary particle diameters are made uniform to suppress an increase in the contact area or if other approaches are effected, porous alumina having a high reflectivity and maintaining a self supporting ability may be formed even if the pore volume is increased by about 30%. It is preferable from this view point that the apparent density is 2.5 g/cm$^3$ or higher. In summary, the apparent density of porous alumina is preferably in a range of 2.5 g/cm$^3$ to 3.3 g/cm$^3$. Assuming that a generally ideal density of alumina is 3.99 g/cm$^3$, a desired packing density is 63% to 83%. Since an optical reflectivity increases the more the pores exist, porous alumina is more preferable which has an apparent density of 2.5 to 3.0 g/cm$^3$ and a packing density of 63 to 75%.

Although porous alumina was formed by using alumina powders having a primary particle diameter of 0.3 μm, the primary particle diameter is not limited to 0.3 μm. Many easy sintering alumina primary particles having a diameter of about 0.1 μm to about 2.4 μm are sold in market. Increasing the primary particle diameter too large as compared to a light wavelength may result in reduction in scattering effects. The primary particle diameter may preferably be 0.1 μm to 1.0 μm.

Although the porous reflector was formed by using alumina, it can be expected to form the reflector of porous ceramics by using silicon oxide ($SiO_2$), zirconia ($ZrO_2$), titania ($TiO_2$), hafnia ($HFO_2$) or zinc oxide ($ZnO$). It is expected to provide a suitable reflector by forming porous ceramics of these materials having a packing density of 63% to 83%.

Although it has been found that a high reflectivity can be obtained by a porous alumina body, the inventors have studied further whether other properties of an LED container, i.e., adhesion to sealing resin and chemical stability, are satisfied or not.

Adhesion between each sample and resin was measured in the following manner.

As shown in FIGS. 4A and 4B, silicone sealing resin was dropped on each sample from a dispenser as spots SP. As shown in FIG. 4A, a circular plate sample used has an outer diameter of 35 mm and a height of 3 mm. Two samples were formed whose upper surfaces each have 100 resin spots. A square plate silver plated sample used has a plan size of 50 mm×50 mm and a height of 1 mm, with 200 resin spots being formed. Each sample with spots was cured for one hour at 150° C. Each sample with silicone resin spots was subjected to 1000 heat shocks at −40 to 85° C.

FIG. 4C is an enlarged view of a resin spot. Four areas along the peripheral area of the spot and one area in a central area were defined, and each area was used as a measurement target. Each spot was observed with a microscope, a stripping or peel-off state of an interface between resin and a substrate was observed, and the number of stripped areas was counted.

A discoloration test of the substrate was conducted in the following manner. The subject sample and comparative samples were maintained for 1000 hours under an environment of a temperature of 85° C. and a humidity of 85%. Thereafter, presence/absence of discoloration was investigated at each measurement point on the sample.

FIG. 4D is a table collectively showing the measurement results.

Stripped points of the comparative example silver plated sample were 11/1000, an occurrence rate is not negligible. Stripped points of the comparative example bulk alumina sample were reduced considerably to 2/1000. Stripped points of the subject porous alumina sample were reduced further to 1/1000. This may be ascribed to high adhesion because of many open pores exposed on the surface. Since good adhesion to silicone resin is ensured, it is expected that luminance deterioration and defects to be caused by interface stripping are hard to occur in a long term use.

Discoloration points of the comparative silver plated sample were extremely large and were 85/100. Discoloration points of the subject alumina sample and comparative alumina sample were not observed and were 0/100. Since discoloration of the sample by nitridation and oxidation is hard to occur, it is expected that device brightness, efficiency and design performance can be maintained stable in a long term use.

It has been found that the subject porous alumina sample has not only a high reflectivity in a wide wavelength range, but also excellent adhesion to sealing resin and chemical stability (environment resistance). It can be expected that the reflectivity can be maintained stably at 95% or higher in a wavelength range of 300 nm to 800 nm. A light emitting device having a high external emission efficiency can be provided by manufacturing an LED reflector or an LED container by using high reflectivity porous alumina.

As alumina raw material, high purity alumina row material was used which had a low content of flux or sintering auxiliary components. A content of substance other than alumina was 0.01 wt % or smaller.

Since impurities contained in the raw material is 0.01 wt % or smaller, it is expected that the impurities in the mold are controlled to be 0.01 wt % or smaller by performing a post-process such as sintering ideally. It may be desired that porous alumina has an alumina purity of 99.99 wt % or higher.

Sintering was performed for 3 hours at 1250° C. If sintering is performed at 800 to 1500° C. lower than a conventional sintering temperature of 1600° C., it is expected to form porous alumina bodies having a high reflectivity. As the sintering temperature is raised, there arises a tendency that sintering progresses and the apparent density of alumina increases. As the density increases, optical permeability appears. It is preferable to set the temperature and density conditions which maintain a minimum mold strength. If sintering is performed under the proper conditions, it is expected to obtain a sintered body which maintains the state that there are a large number of pores and grain boundaries. If there are a large number of pores and grain boundaries, as light is irradiated to a sintered body, the optical scattering effects are enhanced so that the reflectivity may be improved.

Although die press molding is used as a molding method, other molding methods such as die injection molding may also be used. Cutting may be combined.

Alumina material before sintering may contain a proper amount of binder as molding auxiliaries whose material is extinguished during sintering. Binder may be polystyrene, paraffin, stearic acid, polyvinyl alcohol, polyethylene glycol or the like.

The reflector is manufactured in the form of, for example, a reflector ring mounted on the periphery of a light emitting diode chip, a substrate on which a chip is bonded, a housing integrating a reflector ring and a substrate, or the like. The shape and size of a mold may adopt an arbitrary shape and size suitable for the properties of a light emitting device. The reflector may not be components of a light emitting device itself but may be a portion of the components. A plurality of sets of reflectors may be assembled. A thickness of a porous alumina reflector is preferably 0.2 mm or thicker in ordinary cases. The thickness contributes to a reflectivity which lowers if the thickness is thinner than 0.2 mm. From the viewpoint of effective use of space, a thickness of 5 mm or thinner is preferable. If the space is sufficient, a thickness of 5 mm or thicker may be adopted and the reflection performance does not vary.

A light emitting diode chip to be used in combination with a reflector may be a chip having an arbitrary emission wavelength from ultraviolet to infrared wavelength range. Since the reflector has a high reflectivity in a wide wavelength range from ultraviolet to infrared, the effects of improving the external emission efficiency can be exhibited for all wavelengths of light emitting diodes chips. A plurality of light emitting diode chips may be mounted or desired types of chips may be combined. Fluorescence emission materials assembled in a light emitting device may be fluorescent materials having an arbitrary emission wavelength in the wavelength range from ultraviolet to infrared. One or a plurality of types of fluorescent materials may be used. A desired combination of fluorescent materials may be used.

Embodiments of a specific light emitting device will now be described.

Figure 5:
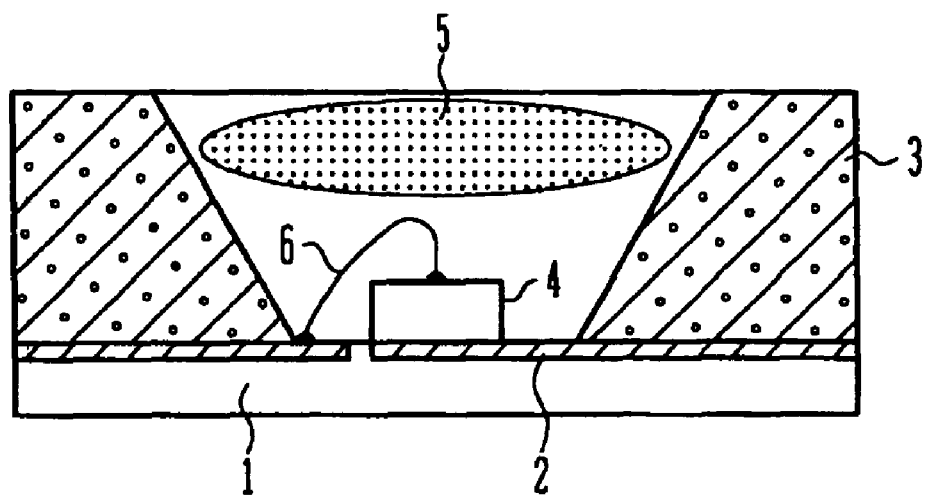
FIG. 5 is a schematic cross sectional view of a light emitting device according to an embodiment.

FIG. 5 is a schematic cross sectional view of a light emitting device constituted of a reflector ring, a blue LED and sealing resin containing dispersed yellow fluorescent material.

Easy sintering high purity alumina raw material powders having an average primary particle diameter of 0.3 μm were filled in a powder press die and pressed at 1000 kg/cm$^2$ to form a reflector ring mold having an outer diameter of 5 mm, a height of 1 mm, and a through hole formed in a central area of the die and having an upper surface opening diameter of 3 mmφ and a lower surface opening diameter of 2.5 mmφ. This mold was sintered for 3 hours at 1250° C. in an atmospheric environment to form a porous alumina reflector ring 3.

A blue LED chip 4 was eutectoid-bonded to a ceramic substrate 1 of 6 mm□ having an electrode pattern, by using AuSn paste 2. An upper electrode of the LED chip 4 was wire-bonded to an electrode region 2 by an Au wire 6. The reflector ring 3 was mounted on the substrate 1 having the LED chip 4 bonded thereto and subjected to the wire bonding. The reflector ring 3 was mounted to position the LED 4 at the ring center, by silicone-containing adhesive.

Lastly, sealing silicone resin 5 containing dispersed yellow fluorescent material was injected in an LED recess defined by the reflector ring 3 and the ceramic substrate 1 with the electrode pattern. The sealing silicone resin was cured to form a white light emitting device.

For comparison, white light emitting devices were formed using reflectors of comparative samples. This bulk alumina sample has a reflector ring made of bulk alumina. A silver plated sample was formed by forming an Ag plated layer on the reflector ring of bulk alumina via a W layer.

A constant current of 350 mA was flowed through the light emitting device, and light collected by an integrating sphere was detected with a photodetector to evaluate brightness of the device. Brightness was relatively evaluated by setting the brightness of the sample device using the Ag plated reflector ring as 100.

Measurement results are shown in the rightmost column of the table shown in FIG. 4D. A brightness of the light emitting device using the bulk alumina reflector was 102 which is higher than that of the device using the Ag plated reflector. A brightness of the light emitting device using the porous alumina reflector was 114 which is highest in three devices. The light emitting device using the porous alumina reflector can provide brighter emission characteristics than those of the light emitting device using the bulk alumina reflector and the light emitting device using the Ag plated reflector.

As a modification of this embodiment, a light emitting device was formed which used an ultraviolet LED 4 and sealing resin 5 containing three primary color fluorescent materials of red (R), green (G) and blue (B).

Figure 6A:
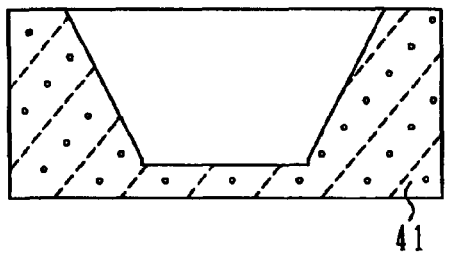
FIGS. 6A to 6D are schematic cross sectional views and schematic plan views illustrating a light emitting device manufacture method according to another embodiment.
Figure 6B:
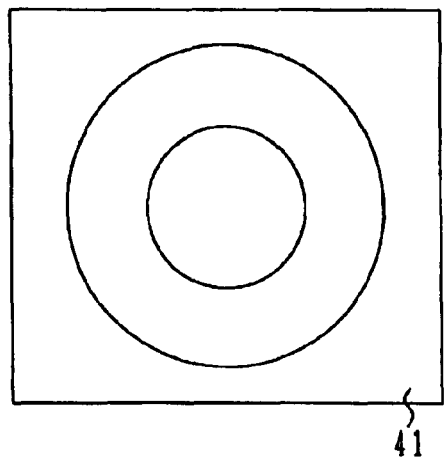
Figure 6C:
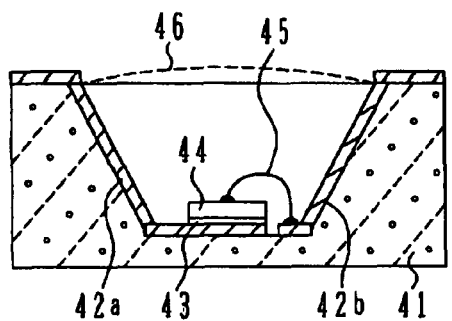
Figure 6D:
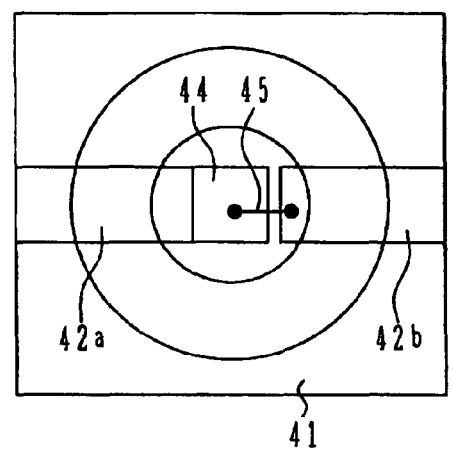

FIGS. 6A to 6D show a light emitting device according to another embodiment. FIGS. 6A and 6C are cross sectional views and FIGS. 6B and 6D are plan views.

As shown in FIGS. 6A and 6B, easy sintering high purity alumina raw material powders having an average primary particle diameter of 0.3 μm were filled in a powder press die and pressed at 1000 kg/cm$^2$ to form a mold of a reflector ring substrate of a concave shape having an upper opening and an inclined sidewall. The mold was sintered for 3 hours at 1250° C. in an atmospheric environment.

As shown in FIGS. 6C and 6D, electrode patterns 42a and 42b are formed on the reflection ring substrate 41 by printing conductive paste or by other methods. A bottom electrode of a blue LED chip 44 is eutectoid-bonded to one electrode 42a on the reflector ring substrate by using AuSn paste 43. A top electrode of the blue LED chip 44 is wire-bonded to the other electrode 42b on the reflector ring substrate by an Au wire 45. Sealing silicone resin 46 containing dispersed yellow fluorescent material is injected in the recess of the reflector ring substrate, and thereafter cured. In this manner, the light emitting device for emitting white light is manufactured.

The structure of the light emitting device is not limited to this embodiment. For example, electrode shapes may be varied in many ways.

Figure 6E:
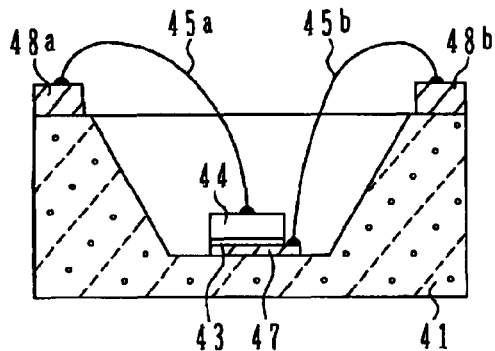
FIGS. 6E and 6F are schematic cross sectional views showing modifications of the light emitting device.

FIG. 6E shows the structure that electrodes are formed only on a flat surface. An electrode 47 is formed on the bottom of the recess, and two electrodes 48a and 48b are formed on the upper surface outside the recess. A bottom electrode of the blue LED chip 44 is eutectoid-bonded to the electrode 47 by using AuSn paste 43. The electrode 48a on the upper surface and the top electrode of the LED chip 44 are wire-bonded by an Au wire 45a. The electrode 48b on the upper surface and the bottom electrode 47 of the LED chip 44 are wire-bonded by an Au wire 45b.

Electrodes may be buried in the sintered alumina body.

Figure 6F:
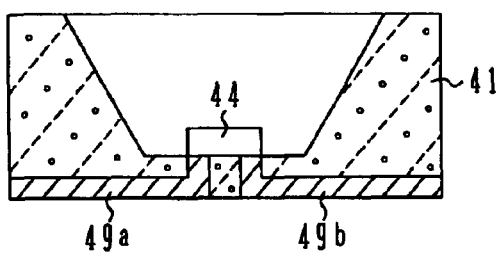

As shown in FIG. 6F, if sintering is performed in an oxidizing atmosphere, metal electrodes 49a and 49b of metal which is hard to be oxidized, and conductive even if the metal is oxidized, are buried in an aluminum mold. An LED chip 44 has two electrodes on the top surface thereof which electrodes are flip-chip bonded to the electrodes 49a and 49b.

An emission wavelength of LED can be freely selected. Since a reflectivity in the ultraviolet range is considerably higher than that of Ag, high advantages are expected for a light emitting device having ultraviolet emission components.

Figure 7A:
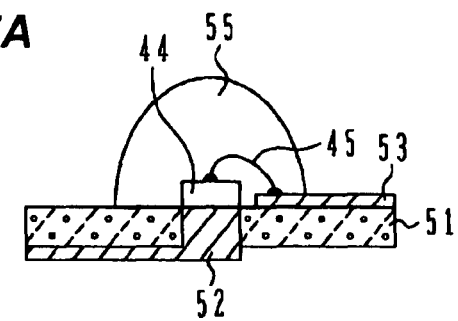
FIGS. 7A and 7B are a schematic cross sectional view and a schematic plan view of a light emitting device according to another embodiment.
Figure 7B:
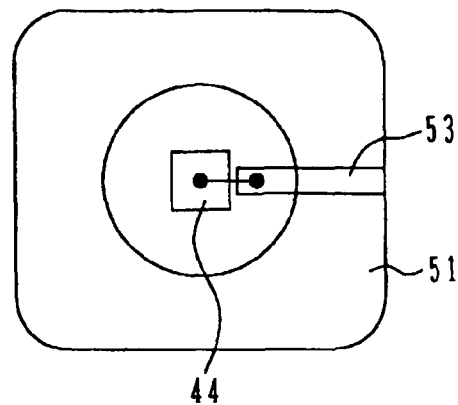

As shown in FIGS. 7A and 7B, a light emitting device may be made using a plate-shaped high reflectivity alumina substrate made of porous alumina. FIG. 7A is a cross sectional view and FIG. 7B is a plan view. A porous alumina substrate 51 is formed with a bottom electrode 52 and a top surface electrode 53. The bottom electrode extends on the bottom surface of the substrate, passes through the substrate at an LED mount position and is exposed at the top surface. An LED chip 44 is connected to the exposed electrode 52, and a top electrode of the LED chip 44 is bonded to the other electrode 53 by an Au wire 45. Resin 55 is coated covering the LED chip 44.

Figure 8:
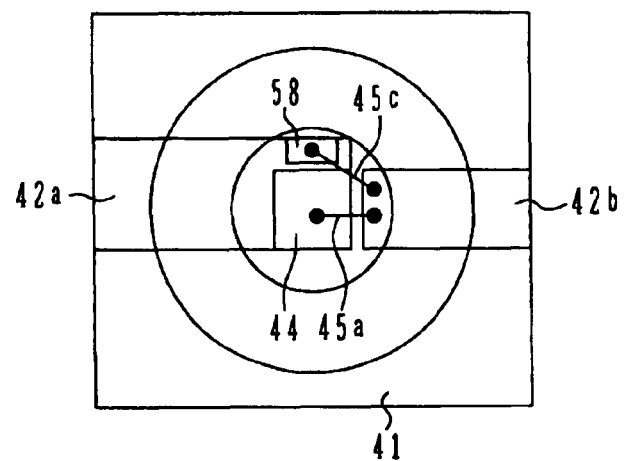
FIG. 8 is a schematic plan view showing a modification of the light emitting device.

FIG. 8 shows an example provided with a protective diode. A high reflectivity alumina sintered body having an inclined sidewall such as shown in FIGS. 6A and 6B is formed, and two electrodes 42a and 42b such as shown in FIGS. 6C and 6D are formed. The electrode 42a is formed broadly. Bottom surfaces of the LED chip 44 and a protective diode chip 58 are mounted on the electrode 42a. Top electrodes of the LED chip 44 and protective diode chip 58 are bonded to the electrode 42b by Au wires 45a and 45c. In this manner, a light emitting device equipped with a protective diode in a recess can be manufactured. It is possible to prevent excessive current from flowing through the LED chip 44.

The present invention has been described in connection with the experiment results and preferred embodiments. The invention is not limited only to the above embodiments. It will be apparent to those skilled in the art that other various modifications, improvements, combinations, and the like can be made.

What we claim are:

1. A light emitting device comprising:
a reflector having a reflection surface made of porous alumina having an apparent density of 2.5 to 3.3 g/cm$^3$;
said porous alumina being an aggregation of alumina particles having an average diameter of 0.1 to 1.0 μm; and
a light emitting diode (LED) disposed on or near said reflection surface.

2. The light emitting device according to claim 1, wherein said porous alumina has an alumina purity of 99.99 wt % or higher.

3. The light emitting device according to claim 1, wherein said reflection surface has a relative reflectivity of 95% or higher in a wavelength range of 300 to 800 nm, relative to a reflectivity of BaSO$_4$.

4. The light emitting device according to claim 1, further comprising a resin sealing body burying said LED and tightly contacting said reflection surface.

5. The light emitting device according to claim 4, wherein said LED is a blue or ultraviolet LED and said resin sealing body contains dispersed fluorescent material.

6. The light emitting device according to claim 1, wherein said reflector comprises a die having a diameter of 20 to 35 mm and a height of 1 to 5 mm.

7. The light emitting device according to claim 1, wherein said reflector comprises a die having a through hole at a central area.

8. The light emitting device according to claim 7, wherein said through hole has an upwardly broadening cross-section.

9. The light emitting device according to claim 1, wherein said reflector has a concave portion.

10. The light emitting device according to claim 9, wherein said concave portion has an inclined sidewall.

11. The light emitting device according to claim 10, further comprising electrode patterns formed on the reflector, wherein at least one of the electrode patterns extends into the concave portion.

12. The light emitting device according to claim 11, wherein said LED is disposed on said at least one of said electrode patterns.

13. A reflector having a reflection surface made of porous alumina having an apparent density of 2.5 to 3.3 g/cm$^3$, and said porous alumina being an aggregation of alumina particles having an average diameter of 0.1 to 1.0 μm.

14. The reflector according to claim 13, wherein said porous alumina has an alumina purity of 99.99 wt % or higher.

15. The reflector according to claim 13, wherein said reflection surface has a relative reflectivity of 95% or higher in a wavelength range of 300 to 800 nm, relative to a reflectivity of BaSO$_4$.

16. The reflector according to claim 13, wherein said reflector comprises a die having a diameter of 20 to 35 mm and a height of 1 to 5 mm.

17. The reflector according to claim 13, wherein said reflector comprises a die having a through hole at a central area.

18. The reflector according to claim 17, wherein said through hole has an upwardly broadening cross-section.

19. The reflector according to claim 13, wherein said reflector has a concave portion.

20. The reflector according to claim 19, wherein said concave portion has an inclined sidewall.

21. A method for manufacturing a light emitting device comprising a reflector having a reflection surface made of porous alumina having an apparent density of 2.5 to 3.3 g/cm$^3$, said porous alumina being an aggregation of easy sintering alumina primary particles having an average diameter of 0.1 to 1.0 μm, and a light emitting diode (LED) disposed on or near said reflection surface;
the method comprising the steps of:
(a) pressing said easy sintering alumina primary particles having said average particle diameter of 0.1 to 1.0 μm to form an alumina mold;
(b) sintering said alumina mold to form a porous alumina reflector; and
(c) disposing said LED on or near said porous alumina reflector.

22. The method for manufacturing a light emitting device according to claim 21, wherein said easy sintering alumina primary particles in said step (a) have a purity of 99.99 wt % or higher.

23. The method for manufacturing a light emitting device according to claim 21, wherein said alumina mold is sintered at 800 to 1500° C. in said step (b).

* * * * *